United States Patent [19]

Smith et al.

[11] Patent Number: 5,532,513

[45] Date of Patent: Jul. 2, 1996

[54] METAL-CERAMIC COMPOSITE LID

[75] Inventors: Charles Smith, Ramona; Masyood Akhtar, San Diego; Michael M. Chau, San Diego; David Savage, San Diego, all of Calif.

[73] Assignee: Johnson Matthey Electronics, Inc., Spokane, Wash.

[21] Appl. No.: 272,354

[22] Filed: Jul. 8, 1994

[51] Int. Cl.$^6$ .................. H01L 23/053; H01L 23/06
[52] U.S. Cl. .................. 257/703; 257/704; 257/705; 257/706; 257/729
[58] Field of Search ................. 257/701–706, 257/729, 77, 712

[56] References Cited

U.S. PATENT DOCUMENTS

| | | | |
|---|---|---|---|
| 3,941,916 | 3/1976 | Morse | 174/52 |
| 4,141,029 | 2/1979 | Dromsky | 357/70 |
| 4,229,758 | 10/1980 | Ikari | 357/74 |
| 4,291,815 | 9/1981 | Gordon et al. | 220/200 |
| 4,331,253 | 5/1982 | Gordon et al. | 220/200 |
| 4,331,258 | 5/1982 | Geschwind | 220/359 |
| 4,366,342 | 12/1982 | Breedlove | 174/52 |
| 4,546,405 | 10/1985 | Hultmark et al. | 257/722 |
| 4,601,958 | 7/1986 | Levine | 428/677 |
| 4,640,436 | 2/1987 | Miyoshi et al. | 220/359 |
| 4,640,438 | 2/1987 | Trevison et al. | 220/359 |
| 4,666,796 | 5/1987 | Levine | 428/670 |
| 4,737,418 | 4/1988 | Slattery | 428/672 |
| 4,746,583 | 5/1988 | Falanga | 428/632 |
| 4,833,102 | 5/1989 | Byrne et al. | 437/218 |
| 4,835,067 | 5/1989 | Levine | 428/669 |
| 4,838,935 | 6/1989 | Dunlop et al. | 75/230 |
| 4,842,961 | 6/1989 | Basile et al. | 428/672 |
| 4,872,047 | 10/1989 | Fister et al. | 357/67 |
| 5,005,631 | 4/1991 | Dwivedi | 164/97 |
| 5,045,639 | 9/1991 | Liu et al. | 174/52.4 |
| 5,119,864 | 6/1992 | Langensiepen et al. | 164/97 |
| 5,240,062 | 8/1993 | Langensiepen et al. | 164/97 |
| 5,291,062 | 3/1994 | Higgins, III | 257/702 |
| 5,386,339 | 1/1995 | Polinski, Sr. | 257/720 |

FOREIGN PATENT DOCUMENTS 0208361  9/1991  Japan .................. 257/703

OTHER PUBLICATIONS

Abstract Citation of U.S. Pat. No. 3,659,035.

Primary Examiner—Peter Toby Brown
Attorney, Agent, or Firm—Christie, Parker & Hale

[57] ABSTRACT

A lightweight composite lid for a package containing a semiconductor device formed of a porous ceramic body filled with a material having a thermal conductivity greater than air.

5 Claims, 2 Drawing Sheets

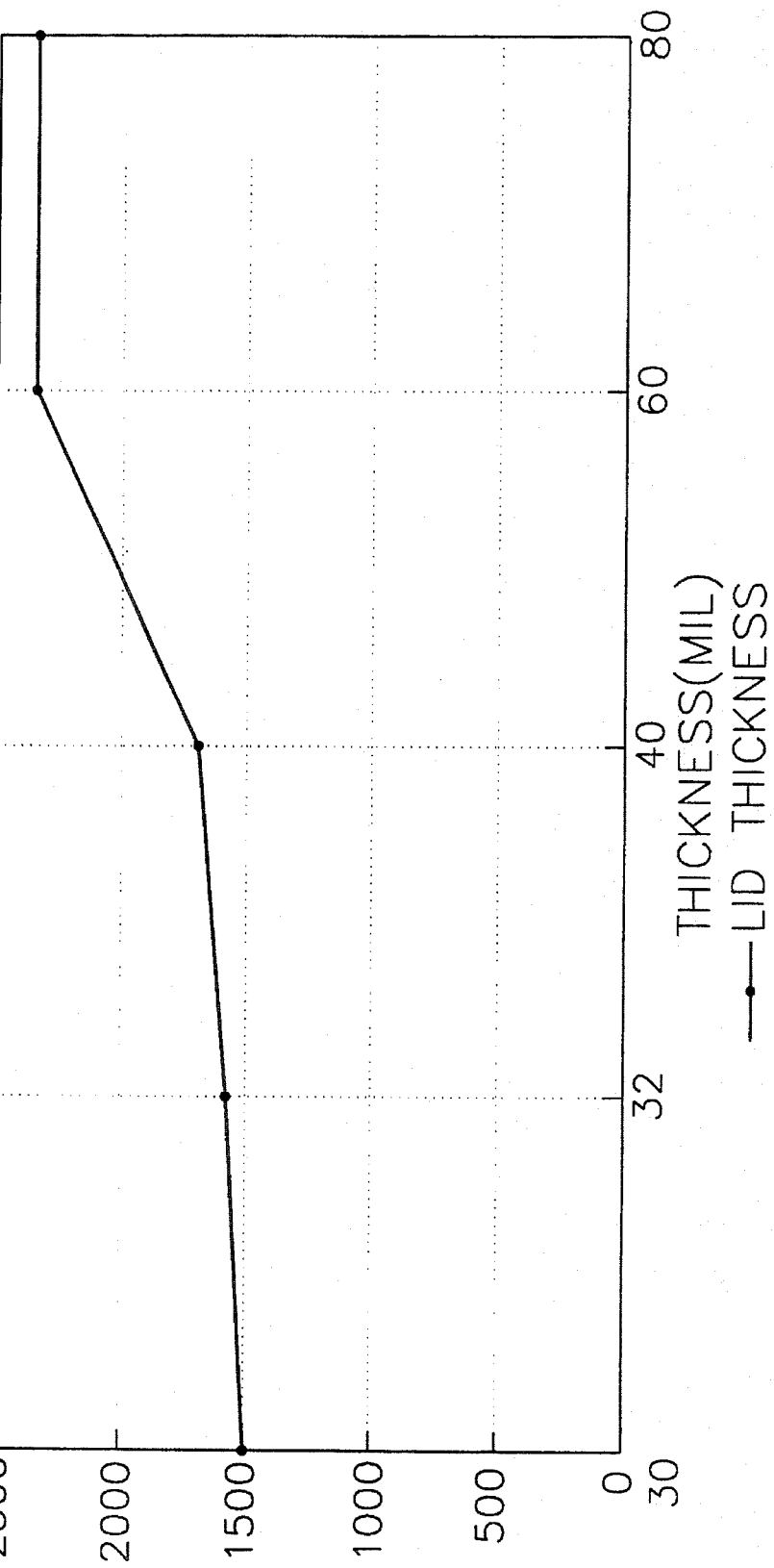

METAL-CERAMIC COMPOSITE LID

BACKGROUND OF THE INVENTION

1. Field of the Invention

This invention relates to a light weight, sealing cover, or lid, which is suitable for the packaging of semiconductor devices; more particularly to a light weight lid which has a high thermal conductivity and is also electrically conductive.

2. Description of the Prior Art

The use of ceramic packages for semiconductor devices is well known. Typically, such a package includes a ceramic substrate to which a lid must be sealed after the semiconductor device is placed therein. Lids of the type used in connection with packages for semiconductor devices are generally of metallic or ceramic materials. Metal lids are often formed of an iron base material such as "Kovar", Alloy 42, Alloy 45 and Alloy 46. The metal lid is usually electroplated with a base coating of nickel or some other metal and a final coating of pure gold is then applied. The gold overlayer provides an oxide-free surface suitable for bonding. This type of lid is often sealed using a preformed solder frame that is placed between the lid and the package housing and then the lid and package is sealed by reflowing the solder preform.

In addition to metal lids, it has also been proposed to use ceramic lid assemblies for hermetic sealing of semiconductor packages. Such ceramic lids may be provided with a heat fusible layer around a periphery for hermetic sealing or a non hermetic seal using epoxy, cyanate ester, silicone or any other suitable organic adhesive. Ceramic materials which are used include oxides and nitrides of aluminum, and oxides of beryllium and magnesium. Where ceramic lid assemblies are employed, preform solder frames may not be necessary to accomplish bonding.

SUMMARY OF THE INVENTION

The present invention provides a lightweight composite lid which has a high thermal conductivity and better coefficient of thermal expansion (CTE) matched to the ceramic substrate, e.g. alumina, than conventional metal lids including aluminum, and which is more economical than conventional lids. Lids in accordance with the present invention are light weight and may eliminate the need to use plated nickel then plated gold with preforms, and possess thermal conductivity superior to metal lids. This performance advantage is especially important for so called "flip chip" technology or other methods of die attachment where heat is removed through the lid instead of the package. The light weight composite lid allows for a better coefficient of thermal expansion match with the ceramic package.

In accordance with the invention, a composite lid is provided for a package containing a semiconductor device. The lid comprises a porous ceramic body, also known as ceramic "sponge", the pores of which are filled with a thermally conductive material instead of air to enhance the lid's thermal conductivity and removal of heat through the lid. The thermal conductive material has a thermal conductivity greater than air. Useful ceramic materials for the composite lid include silicon carbide, silicon nitride, aluminum nitride, boron carbide, boron nitride and other thermally conductive ceramics, including glass ceramics. The preferred ceramic is silicon carbide because of its high thermal conductivity and its low coefficient of thermal expansion. The CTE of silicon carbide is lower than most ceramics and metals. Therefore, it is well suited for use in a light weight lid in accordance with the invention. However, commercially available ceramics such as silicon carbide generally have a high degree of porosity making it susceptible to moisture intake and unsuitable for semiconductor package lids. Also, silicon carbide by itself would not match the coefficient of thermal expansion of the alumina ceramic package. It is only when combined with metal such as aluminum and its alloys, i.e. impregnated, that the CTE match to alumina is achieved and a lid impervious to moisture intake is obtained. Preferred thermally conductive materials for filling the pores of a ceramic body include aluminum, copper, indium, silver, gallium, iron, titanium and magnesium, and alloys of each of the foregoing. Advantageously, the lid comprises a porous ceramic body having a thermally conductive material impregnated into the pores of the porous ceramic body. It is presently believed that there is a continuous metal matrix in the composite body.

BRIEF DESCRIPTION OF THE DRAWINGS

FIGS. 3 is a graph illustrating the relationship of fracture stress and thickness of an aluminum and silicon carbide composite.

Detailed Description

A lid is manufactured by first making blanks of the desired thickness and then machining the blanks to the desired shape. Alternatively, the lids can also be produced to near or net shape. A suitable adhesive is then used to join the lid to the package to form a seal.

Figure 1:
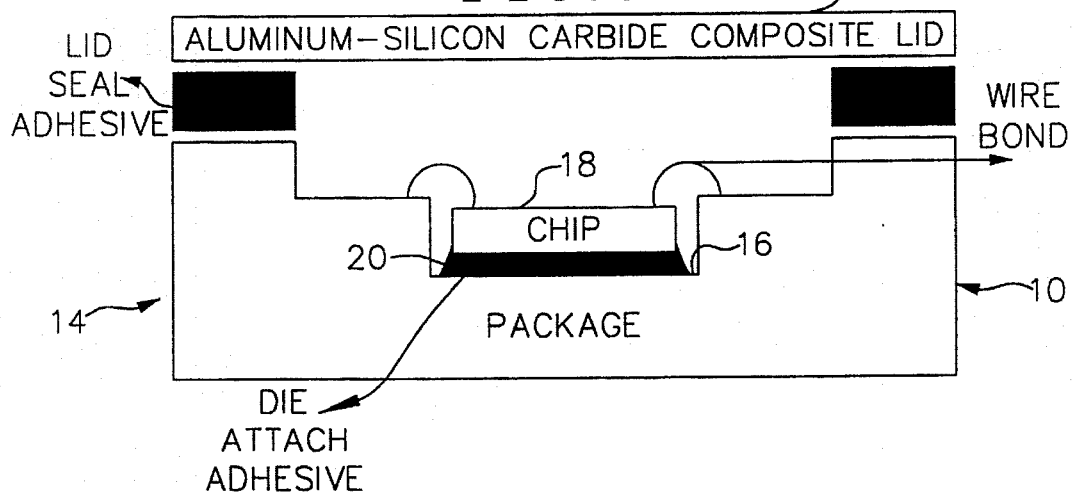
FIGS. 1 and 2 are schematic diagrams of packages for a semiconductor device.

FIG. 1 shows how a ceramic package 10 is assembled with a lid 12 to be sealed to the ceramic package to form an enclosure 14 for a semiconductor device 18 secured by adhesive 20 to a ceramic substrate base 22 formed integrally with the package.

The following examples will serve to illustrate the invention.

A ceramic and thermally conductive filler, such as an aluminum and silicon carbide composite is used as a starting material and machined to a lid configuration and dimensions.

Figure 2:
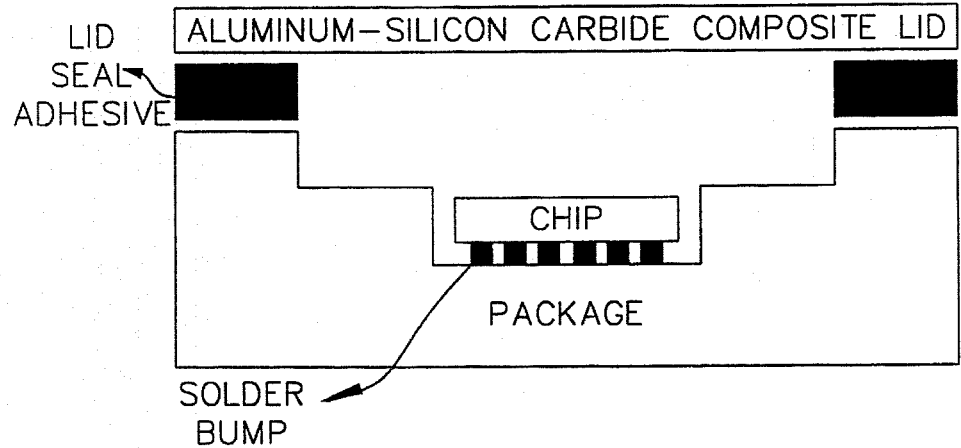

The aluminum and silicon carbide composite, which is made in the form of a lid for a package and provided with an adhesive tape such as "R398NA" from Ciba Geigy or a paste referred to as "LESP8680" available from AI Technology. The schematic diagrams shown in FIGS. 1 and 2 illustrate how the lid is joined to the package to encapsulate the semiconductor device.

In this example, Ciba Geigy "R398NA" tape was cut as a strip 1/16th inch wide and placed around the perimeter of the lid which was 1.45 inch by 1.45 inch. It was then attached to a 1.5 inch by 1.5 inch ceramic substrate using a clip having a pressure of about 2.0 pounds. The assembled parts were then cured at 150° C. for 30 minutes.

Alumina lids and aluminum metal lids were also produced as described above and were tested along with the aluminum and silicon carbide composite. Table 1 below shows the adhesion of the different lid types. It is noted that in all cases the substrate material was alumina.

TABLE 1

| | LID TYPES | | |
|---|---|---|---|
| | ALUMINUM | ALUMINA | AL-SILICON CARBIDE |
| SUBSTRATE CRACK | YES | NO | NO |
| BOND LINE CRACK | YES | NO | NO |
| ADHESION (LB.) | N/A | 145 | 154 |

In another example, the paste from AI Technology was dispensed as a bead using an 18 gauge needle on an alumina and aluminum silicon carbide composite lid. The dispensed adhesive was dried at 60° C. for 30 minutes before attaching to the ceramic substrate. The dried lids were placed on a substrate and once again a clip was used to hold the lid and substrate together. Curing was done at 150° C. for 30 minutes. No cracks were detected after lid attachment and an average strength of 250 lbs. was achieved in each case. The graph shown in FIG. 3 illustrates the properties of the aluminum and silicon carbide composites which compares fracture stress with lid thickness.

In yet another example, the aluminum silicon carbide lid is nickel plated then gold plated. A gold tin preform is attached to the plated lid. This assembly is then used to hermetically seal a ceramic pin grid array package.

As indicated previously, silicon carbide is an attractive ceramic for lid use because of its high thermal conductivity. Of the listed materials only expensive diamond and amorphous carbon have higher thermal conductivity than silicon carbide. Other properties of silicon carbide are reported in Table 2.

TABLE 2

CONDUCTIVITY DATA FOR SiC AND METAL

| MATERIAL | THERMAL CONDUCTIVITY WATT/Cm.k @RT |
|---|---|
| 6H—SiC | 4.90 |
| 4H—SiC | app. 4.90 |
| Si | 1.50 |
| GaAs | 0.60 |
| GOLD | 3.19 |
| ALUMINUM | 2.36 |
| COPPER | 4.03 |
| SILVER | 4.29 |
| BERYLLIUM | 2.18 |
| DIAMOND (TYPE 1) | 9.94 |
| DIAMOND (TYPE 11A) | 26.20 |
| DIAMOND (TYPE 11B) | 15.20 |
| CARBON (II TO LAYER PLANES) | 21.30 |
| CARBON (L TO LAYER PLANES) | 0.0636 |

Table 3 describes aluminum-silicon carbide's

TABLE 3

PROPERTIES OF ALUMINUM SILICON CARBIDE AS COMPARED TO OTHER MATERIALS

| MATERIAL | THERMAL CONDUCTIVITY W/mK | CTE 10-6/oC |
|---|---|---|
| STEATITE (MgO—SiO2) | 2.5 | 4.2 |
| CORDIERITE | 3.3 | 2.5 |

TABLE 3-continued

PROPERTIES OF ALUMINUM SILICON CARBIDE AS COMPARED TO OTHER MATERIALS

| MATERIAL | THERMAL CONDUCTIVITY W/mK | CTE 10-6/oC |
|---|---|---|
| (MgO-2A12O3-5SiO2) | | |
| SiC | 270.0–490 | 2.7 |
| DIAMOND | 2000.0 | 2.0 |
| QUARTZ | 2.0 | 2.2 |
| BERILLIUM OXIDE | 215.0 | 2.9 |
| ALUMINA | 16.0 | 6.4 |
| ALLOY45 | 17.0 | 5.9 |
| ALLOY42 | 12.0 | 7.0 |
| KOVAR | 11.0 | 5.4 |
| Al—SiC | 130–250 | 6–8 |

There are different techniques available for producing ceramic components that are useful in accordance with the invention. However, it is best to use composites which maximize the amount of the ceramic component of the composite. For example, aluminum and silicon carbide composite can be made by casting, e.g., adding silicon carbide to a molten metal, e.g., aluminum, or by starting with a silicon carbide body and infiltrating the pores of the body with a thermally conductive filler, e.g., molten aluminum which is then solidified in situ. The reason impregnation is necessary is to adjust the CTE of the composite to match the substrate and provide a material of high thermal conductivity. Filling the pores of the silicon carbide with a material having higher thermal conductivity than air results in a ceramic composite of higher thermal conductivity. Tables 4 and 5 show properties of cast and infiltrated Al-SiC composites and properties of Al-SiC composites.

TABLE 4

Properties of as Cast and Infiltrated Aluminum - Silicon Carbide Composite

| | Al—SiC composite | |
|---|---|---|
| | As Cast | Infiltrated |
| CTE | 12–16 | 6–7 |
| Thermal Conductivity (W/m-K) | 130–170 | 170–220 |
| Young Modulus (GPa) | 120–150 | 200–240 |
| Density (g/cc) | 2.7–2.85 | 1.8–3.0 |
| Four Point Bend Test (MPa) | 400–475 | 250–350 |
| Fracture Toughness (MPa-m$^{-2}$) | 16–20 | 8–10 |

TABLE 5

PROPERTIES OF ALUMINUM-SILICON CARBIDE COMPOSITE

| ALUMINUM | ALUMINUM |
|---|---|
| Filler (Volume Fraction) | 70% SiC |
| Density (Mg/m) | 3.0–3.04 |
| Thermal Conductivity (W/mK) | 130–250 |
| Specific Heat Capacity (KJ/KgK) | 0.77–0.81 |
| Thermal Diffusivity (mm/s) | 80–90 |
| Electrical Conductivity (micro ohm cm) | 15–30 |
| Dynamic Modulus (GPa) | 200–230 |
| Flexural Modulus (GPa) | 190–210 |

TABLE 5-continued

PROPERTIES OF ALUMINUM-SILICON CARBIDE COMPOSITE

| ALUMINUM | ALUMINUM |
| --- | --- |
| Poisson Ratio | 0.23–0.24 |
| Tensile Strength (MPa) | Greater than 200 |
| Flexural Strength (MPa-m$^{-2}$) | Greater than 300 |
| Flexural Strain at Failure (%) | Greater than 0.15 |
| Hardness HV50 (Kg/mm) | Greater than 350 |
| Fracture Toughness (MPam) | Greater than 20 |

It is apparent from the foregoing that various changes and modifications may be made without departing from the invention. Accordingly, the invention should be limited only by the appended claims.

We claim:

1. An enclosure for a semiconductor device, the enclosure comprising:

a package having a cavity with a substrate base to which the semiconductor device may be attached, the package being formed of a ceramic; and a lightweight lid secured to the package over the cavity to form the enclosure, the lid having a porous ceramic body with a material having a thermal conductivity greater than air disposed within the porous body to form a composite having a thermal conductivity substantially greater than that of the package, and having a coefficient of thermal expansion sufficiently close to that of the package so as to avoid damage to the lid and package due to temperature change during normal operation of the semiconductor device.

2. An enclosure according to claim 1 wherein said ceramic body of the lid comprises at least one of silicon carbide, silicon nitride, aluminum nitride, and boron nitride.

3. An enclosure according to claim 2 wherein pores in the ceramic body of the lid are filled with at least one of aluminum, copper, indium, silver, gallium, iron, titanium and magnesium, and alloys of each of the foregoing.

4. An enclosure according to claim 1 wherein the pores of the lid have been impregnated with liquid metal from the group consisting of aluminum, copper, indium, silver, gallium, iron, titanium and magnesium, and alloys of each of the foregoing, which is then solidified in the pores of said ceramic body.

5. An enclosure according to claims 1, 2, 3, or 4 in which the package is made of alumina.

* * * * *

UNITED STATES PATENT AND TRADEMARK OFFICE
CERTIFICATE OF CORRECTION

PATENT NO. : 5,532,513
DATED : July 2, 1996
INVENTOR(S) : Charles Smith; Masyood Akhtar; Michael M. Chau; David Savage It is certified that error appears in the above-indentified patent and that said Letters Patent is hereby corrected as shown below:

Column 3, line 57, after "carbide's" insert -- physical data. --.
Column 4, line 57, delete "ALUMINUM" (both occurrences).
Column 5, line 6, delete "ALUMINUM" (both occurrences).

Signed and Sealed this

Twenty-fifth Day of February, 1997

Attest:

BRUCE LEHMAN

*Attesting Officer*  *Commissioner of Patents and Trademarks*